(12) United States Patent
Saeki et al.

(10) Patent No.: US 11,551,974 B2
(45) Date of Patent: Jan. 10, 2023

(54) MANUFACTURING PROCESS OF ELEMENT CHIP USING LASER GROOVING AND PLASMA-ETCHING

(71) Applicant: Panasonic Intellectual Property Management Co., Ltd., Osaka (JP)

(72) Inventors: Hidefumi Saeki, Osaka (JP); Atsushi Harikai, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/471,661

(22) Filed: Sep. 10, 2021

(65) Prior Publication Data

US 2021/0407855 A1    Dec. 30, 2021

Related U.S. Application Data

(62) Division of application No. 16/362,933, filed on Mar. 25, 2019, now Pat. No. 11,145,548.

(30) Foreign Application Priority Data

Mar. 28, 2018    (JP) .............................. JP2018-061672

(51) Int. Cl.
*H01L 21/78*    (2006.01)
*H01L 23/544*    (2006.01)
(Continued)

(52) U.S. Cl.
CPC .......... *H01L 21/78* (2013.01); *B23K 26/0006* (2013.01); *B23K 26/364* (2015.10);
(Continued)

(58) Field of Classification Search
None
See application file for complete search history.

(56) References Cited

U.S. PATENT DOCUMENTS

| 8,883,615 B1 | 11/2014 | Holden et al. |
| 2005/0035100 A1 | 2/2005 | Genda |

(Continued)

FOREIGN PATENT DOCUMENTS

| JP | 2005-064231 A | 3/2005 |
| JP | 2006-051517 A | 2/2006 |

(Continued)

OTHER PUBLICATIONS

Japanese Office Action issued in the corresponding Japanese Patent Application No. JP 2018-061672, dated Feb. 1, 2022.

*Primary Examiner* — Nilufa Rahim
(74) *Attorney, Agent, or Firm* — Pearne & Gordon LLP

(57) ABSTRACT

A manufacturing process of an element chip comprises a preparing step for preparing a substrate having first and second sides opposed to each other, the substrate containing a semiconductor layer, a wiring layer and a resin layer formed on the first side, and the substrate including a plurality of dicing regions and element regions defined by the dicing regions. Also, the manufacturing process comprises a laser grooving step for irradiating a laser beam onto the dicing regions to form grooves so as to expose the semiconductor layer along the dicing regions. Further, the manufacturing process comprises a dicing step for plasma-etching the semiconductor layer along the dicing regions through the second side to divide the substrate into a plurality of the element chips. The laser grooving step includes a melting step for melting a surface of the semiconductor layer exposed along the dicing regions.

7 Claims, 13 Drawing Sheets

(51) Int. Cl.
  *H01L 21/268*   (2006.01)
  *B23K 26/00*    (2014.01)
  *B23K 26/364*   (2014.01)
  *H01L 21/3065*  (2006.01)

(52) U.S. Cl.
  CPC ........ *H01L 21/268* (2013.01); *H01L 21/3065* (2013.01); *H01L 23/544* (2013.01); *H01L 2223/5446* (2013.01)

(56) References Cited

U.S. PATENT DOCUMENTS

| | | | |
|---|---|---|---|
| 2005/0101108 A1* | 5/2005 | Genda | H01L 21/78 |
| | | | 257/E21.599 |
| 2006/0035411 A1 | 2/2006 | Oba et al. | |
| 2012/0322232 A1 | 12/2012 | Holden | |
| 2013/0267076 A1 | 10/2013 | Lei et al. | |
| 2014/0099777 A1 | 4/2014 | Mackh et al. | |
| 2014/0141596 A1* | 5/2014 | Matsuzaki | B23K 26/40 |
| | | | 438/462 |
| 2017/0140989 A1* | 5/2017 | Tabuchi | H01L 21/268 |

FOREIGN PATENT DOCUMENTS

| | | |
|---|---|---|
| JP | 2006-269507 A | 10/2006 |
| JP | 2014-523113 A | 9/2014 |
| JP | 2015-519732 A | 7/2015 |

\* cited by examiner

MANUFACTURING PROCESS OF ELEMENT CHIP USING LASER GROOVING AND PLASMA-ETCHING

CROSS REFERENCE TO RELATED APPLICATION

This application is a division of U.S. patent application Ser. No. 16/362,933 filed Mar. 25, 2019, which claims the priority under 35 U.S.C. § 119 with respect to the Japanese Patent Application No. 2018-061672 filed on Mar. 28, 2018, of which entire content is incorporated herein by reference into the present application.

TECHNICAL FIELD

The present invention relates to a manufacturing process of an element chip, and in particular to the manufacturing process of the element chip including a laser grooving step and a dicing step with a plasma exposure.

BACKGROUND

The element chips are produced by individualizing or dicing a substrate including a semiconductor layer and a wiring layer, for example. Typically, the substrate contains a plurality of element regions and dicing regions defining the element regions, in which the dicing regions are removed to form the element chips from the substrate. Patent Document 1 (JPA 2005-064231) discloses a method for dividing a plate-like workpiece, which includes dicing the substrate along the dicing regions by laser scribing (laser grooving) a portion of the substrate along dicing regions and cutting off the remaining portion of the substrate with a cutting blade.

The laser grooving step often uses a pulsed laser beam for suppressing a thermal impact on the substrate. It is known that a laser ablation makes materials composing the substrate on a target of the laser beam scattering as fine particles called as debris, which in turn adhere to the surface of the substrate in the laser grooving step. However, when the remaining portion of the substrate is mechanically cut off after the laser grooving step as taught in Patent Document 1, the debris on the dicing regions of the substrate substantially gives no influence on a production quality of the element chips.

Meantime, a plasma-dicing step for dicing the substrate has recently been proposed, in which after laser-scribing a portion of the substrate, a plasma-dicing step is used for etching the remaining portion along the dicing regions by exposing the substrate within a plasma atmosphere. The source gas and the condition for generating the plasma atmosphere are modified in accordance with the material and a thickness of the material to be processed. Therefore, the flatness and the composition of the debris along the dicing regions give a substantial impact on the production quality of the element chips in the plasma-etching step.

SUMMARY

One aspect of the present invention relates to a manufacturing process of an element chip, which comprises a preparing step for preparing a substrate having first and second sides opposed to each other, the substrate containing a semiconductor layer, a wiring layer and a resin layer formed on the first side, and the substrate including a plurality of dicing regions and element regions defined by the dicing regions; a laser grooving step for irradiating a laser beam onto the dicing regions to form grooves so as to expose the semiconductor layer along the dicing regions; and a dicing step for plasma-etching the semiconductor layer along the dicing regions through the second side to divide the substrate into a plurality of the element chips, wherein the laser grooving step includes a melting step for melting a surface of the semiconductor layer exposed along the dicing regions.

DETAILED DESCRIPTION

Figure 1:
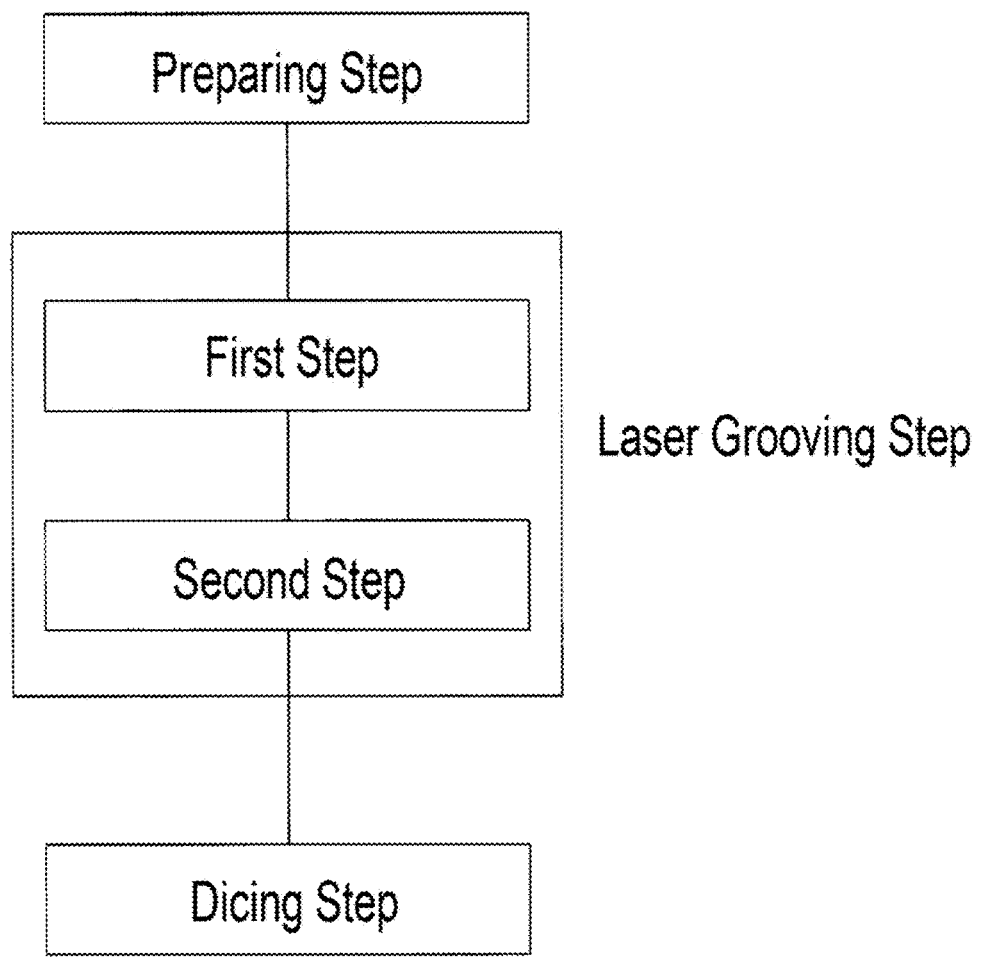
FIG. 1 is a flowchart illustrating some steps of a manufacturing process of an element chip according to a first embodiment of the present invention.

With reference to attached drawings, a manufacturing process of an element chip according to embodiments of the present invention will be described hereinafter. In the description, a couple of terms for indicating the directions (for example, "upper" and "vertical") are conveniently used just for facilitating clear understandings, it should not be interpreted that those terms limit the scope of the present invention. Also, in the drawings, each component of the element chip is illustrated in a relative manner in size for clarifying the shape and the feature thereof, and not necessary in the exact scale.

A substrate to be processed contains a semiconductor layer, a wiring layer (an insulating layer), and a resin layer thereon, and the substrate includes a plurality of dicing regions and element regions defined by the dicing regions. A manufacturing process of an element chip generally comprises steps of preparing the substrate, a laser grooving step for irradiating a laser beam onto the substrate along the dicing regions to form grooves, and a dicing step for plasma-etching the exposed semiconductor layer.

In the laser grooving step, all of the resin layer and the wiring layer are removed along the dicing regions, and a portion of the semiconductor layer may be removed along the dicing regions. The present disclosure suggests homogenizing or planarizing a bottom surface of a trench or groove along the dicing regions prior to the plasma-dicing step, which, in turn, facilitates the plasma-dicing step to be implemented in a reliable and efficient manner so that desired element chips of high quality can be produced.

Typically, the insulating layer often includes Test Element Groups (TEGs) and metal wires (which may collectively be referred to as metal materials) along the dicing regions. Such metal materials have variety of sizes, components, shapes, and thickness. Meanwhile, in order to increase a productivity, a laser beam is often irradiated at a constant intensity to scribe the resin layer and the wiring layer along irradiation preset-lines in the dicing regions. Thus, the laser beam is irradiated under such a condition required to remove the metal materials which are most difficult to be removed (i.e., which are large and thick, or has a low absorption rate of the laser beam). In this instance, the beam intensity of the laser beam is much greater than that required for removing the insulating layer.

In the disclosure, an area where the metal material is provided in the wiring layer along the dicing region is referred to as a metal containing area, while another area where no metal material is provided in the wiring layer (which is composed solely of insulating material) along the dicing region is referred to as a non-metal containing area. Thus, the semiconductor layer in the non-metal containing area is scribed deeper than that in the metal containing area, which forms concave portions in the trench and asperity or irregularity on the bottom of the trench or groove along the dicing region. The metal containing area and the non-metal containing area are provided in the dicing region where the substrate is diced in the thickness direction.

Also, in the laser-grooving step, the wiring or insulating layer is likely scribed to have a tapered shape in a cross section along the width direction. This may form another asperity on a side surface of the trench due to the metal materials in the dicing regions. Furthermore, since the laser beam ablates the wiring layer close to the metal containing area less than the wiring layer close to the non-metal containing area, the former wiring layer has a tapered angle less than that of the latter wiring layer. In other words, when the wiring layer has both of the non-metal containing area and the metal containing area, the width of the trench may vary along the dicing region.

The dicing step is carried by the Bosch process including a film depositing step and a film etching step, which are repeatedly carried out. The Bosch process deposits a film on the bottom and side surfaces of the trench in the film depositing step, and removes the film on the bottom of the trench and then dig the exposed semiconductor layer in the depth direction. The conditions of the film depositing step and the film etching step are selected so that the film remains on the side surface of the trench, which allows the semiconductor layer to be etched in the depth direction substantially perpendicular to the bottom. In other words, it is desired to form the layer having uniform thickness in the trench during the film depositing step, in order to etch the semiconductor layer in the depth direction and produce the element chips having un-uniform configuration.

However, as discussed above, the asperity or irregularity in the trench formed in the laser grooving step likely causes the layer in the trench formed during the film depositing step have the inhomogeneous thickness. Thus, the produced element chips have the un-uniform configuration, vertical-striped patterns on the side walls, and side-etched portions in the interface between the semiconductor layer and the wiring layer. This tends to deteriorate the appearance and the deflecting strength. Furthermore, the non-uniform width of the trench fails to stabilize the quality of the produced element chips.

In the meanwhile, as the laser grooving step causes the debris, typically before the dicing step, the cleaning step is carried out to remove the debris by etching or scribing. The cleaning step is made under a condition such that the most engrained debris, including for example, the debris containing metal components and a substantial amount of the adhering debris can be removed (e.g., for an extended time). However, the material and the scattering of the debris caused in the non-metal containing area and the metal containing area are different from each other. For example, the debris containing much metal material adheres to a region around the metal containing area. Thus, the cleaning step under the aforementioned condition etches or scribes the trench more deeply in the non-metal containing area or the area other than the metal containing area. Thus, the asperity of the trench formed before the cleaning step is emphasized by the cleaning step.

To address this, the present embodiment has a step for melting the semiconductor layer after forming the trench or unfinished trench in the laser grooving step. The melted semiconductor layer planarizes the bottom of the trench without the asperity, which substantially enhances the reliability of the following plasma-etching step.

The laser grooving step may include a first step for irradiating a laser beam (referred to as an ablation laser beam) onto the dicing regions to ablate the resin layer and the wiring layer, and a second step for again irradiating a laser beam (referred to as a melting laser beam) onto the dicing regions to melt the exposed surface of the semiconductor layer.

In the second step, the melting laser beam irradiated to the trench has such an intensity enough to melt the semiconductor layer, but less to ablate the exposed semiconductor layer on the bottom of the trench. The exposed surface of the semiconductor layer on the bottom of the trench having the asperity is melted or amorphous-alloyed to flow on and planarizes the surface of the trench. Then, the melted semiconductor hardens to form a new flat layer on the bottom of the trench.

In the second step, the melting laser beam melts the semiconductor layer and also diffuses the debris adhering to the side wall of the trench. At least a portion of the diffused debris is absorbed and incorporated within the melted semiconductor to form the new layer on the bottom of the trench. Thus, a localization of the debris is eliminated in the second step to homogenize the bottom of the trench. This allows reduction of the time required for the cleaning step, and enhances the flatness of the bottom in the trench after the cleaning step.

Furthermore, in the second step, the wiring layer exposed on the side wall of the trench is melted, which reduces the asperity thereon and improves the verticality thereof. Also, the width of the trench is constant so that the linearity is improved. Therefore, the plasma process is achieved in a more reliable manner so that the produced element chip gets better quality.

First Embodiment

Figures 2A, 2B:
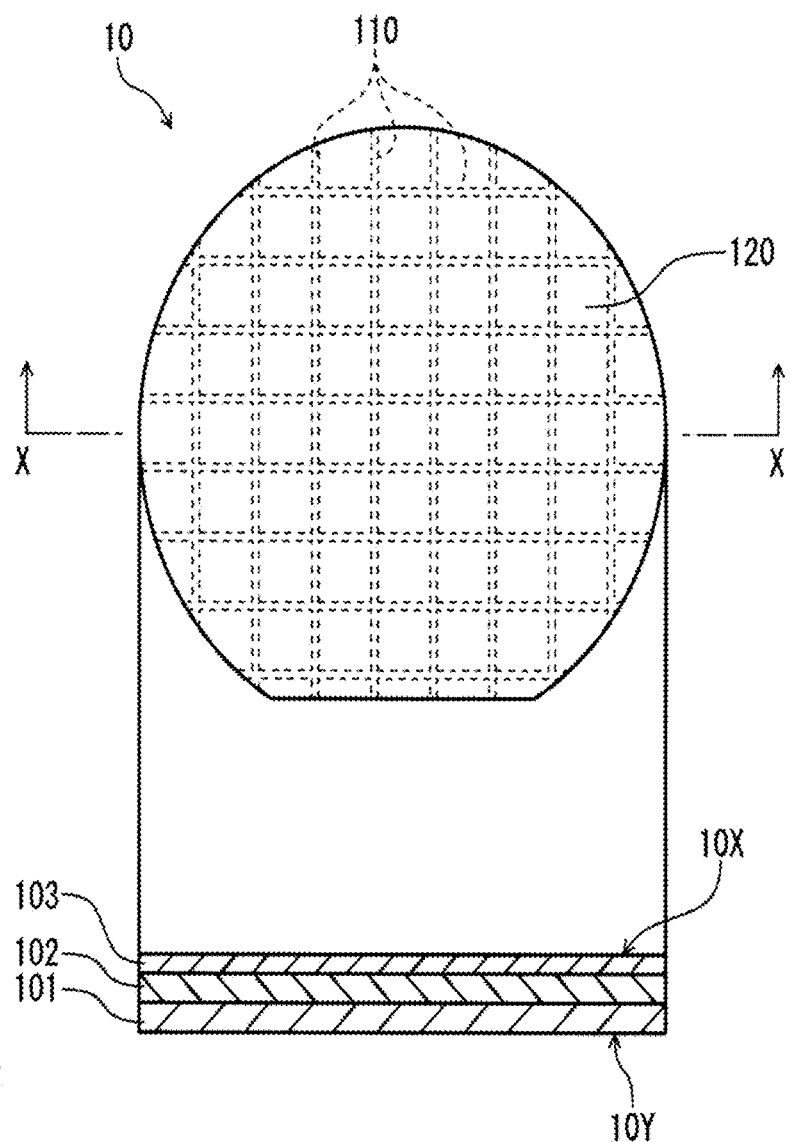
FIG. 2A is a top plan view of a substrate which is an object to be processed.
FIG. 2B is a cross-sectional view taken along a line X-X of FIG. 2A.
Figures 3A, 3B:
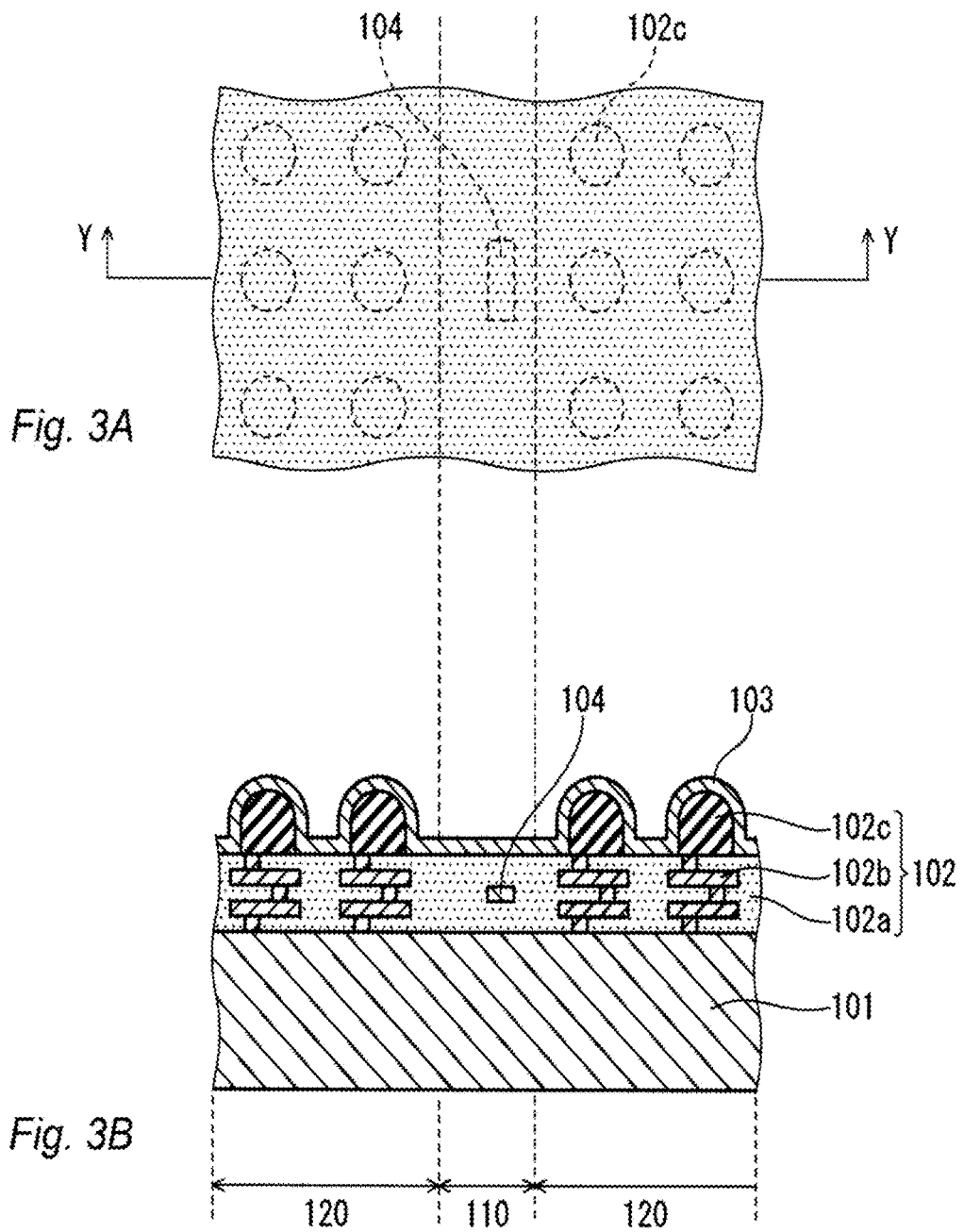
FIG. 3A is an enlarged top plan view schematically illustrating a portion of the substrate.
FIG. 3B is a cross-sectional view taken along a line Y-Y of FIG. 3A.

Referring to drawings, a manufacturing process of an element chip will be described in detail hereinafter. FIG. 1 is a flowchart illustrating some steps of the manufacturing process according to a first embodiment of the present invention. FIG. 2A is a top plan view of a substrate which is an object to be processed by the present embodiment, and FIG. 2B is a cross-sectional view taken along a line X-X of FIG. 2A. FIG. 3A is an enlarged top plan view schematically illustrating a portion of the substrate, in which a resin layer 103 is depicted with dots, and FIG. 3B is a cross-sectional view taken along a line Y-Y of FIG. 3A.

1) Preparing Step: Firstly, a substrate 10 which is an object to be processed or diced is prepared (FIG. 1A). The substrate 10 has first and second sides 10X, 10Y, and includes a semiconductor layer 101, a circuit layer 102 and a resin layer 103 stacked on the first side 10X thereof. Also, the substrate 10 contains dicing regions 110 and element regions 120 each defined by the dicing regions 110.

A circuit layer such as a semiconductor circuitry, an electronic component, and/or a MEMS (not shown) may be formed in the element regions 120. The circuit layer 102 includes a test circuitry known as a TEG (Test Element Group) containing a metal material 104 such as cupper (Cu) and aluminum (Al) in the dicing regions thereof.

The dicing regions 110 are not limited to straight lines in shape and may have any configurations determined in accordance with the outline of the desired element chips 30 (shown in FIG. 2A), which may be a zig-zag line and a wavy line for example. Thus, the element chips 30 may have a rectangular or hexagonal outline.

The dicing regions 110 has a width, which is not limited to particular one and may be selected appropriately in accordance with the size of the substrate 10 and the element chips 30. The dicing regions 110 may have the width in a range between 10-300 μm, for example, and each of the dicing regions 110 may have the width same as or different from one another. Typically, the substrate 10 may contain a plurality of the dicing regions 110. A pitch between the adjacent dicing regions 110 is not limited to particular one and may be designed appropriately in accordance with the size of the substrate 10 and the element chips 30.

Also, the semiconductor layer 101 may be made of silicon (Si), gallium arsenide (GaAs), gallium nitride (GaN), or silicon carbide (SiC), for example.

The wiring layer 102 may include a multi-stacked wiring layer containing low-dielectric layers of a low-k material and wiring layers of copper (Cu), and also contain a variety of metals, insulating layers made of material such as silicon dioxide ($SiO_2$), silicon nitride ($Si_3N_4$), lithium tantalate ($LiTaO_3$), and lithium niobate ($LiNbO_3$). The wiring layer 102 may further include electrode pads and bumps 102.

The resin layer 103 is formed to protect the element regions 120, which may contain so-called a resist material including a photoresist made of, for example, a thermosetting resin such as polyimide, a photoresist such as a phenol resin, and a soluble resin such as polyvinyl alcohol and soluble polyester resin, and a phenol resin. The resin layer 103 may be formed by, for example, forming a sheet of the resist material and then attaching the sheet to the semiconductor layer 101 or to the wiring layer 102 prior to formation of the resin layer 103, or by applying a material solution of the resist material to the semiconductor layer 101 or to the wiring layer 102 prior to formation of the resin layer 103 by means of the spin-coating or spray-coating techniques.

2) Laser Grooving Step: In the laser grooving step, a laser beam is irradiated to the first side 10X of the substrate along the dicing regions 110 to form a plurality of trenches 111 (FIG. 4C) shallower than that of the substrate 10, which correspond to the dicing regions 110. During the laser grooving step, the substrate 10 may be held on a conveying carrier 20 (FIG. 9) as will be described later for easy handling thereof.

The trench 111 may have a depth approximately same or close to that of the wiring layer 102 of the substrate 10. In particular, the depth of the trench 111 may be in a range between 80-120% of the wiring layer 102, or in a range between 100-120% of the wiring layer 102. Thus, the resin layer 103 and all or most of the wiring layer 102 are removed along the trench, and a portion of the semiconductor layer 101 is also removed in the laser grooving step.

The laser grooving step according to the present embodiment includes a first step and a second step. In the first step, an ablation laser beam La is irradiated onto the resin layer 103 along the dicing regions 110 to ablate the resin layer 103 and the wiring layer 102, thereby to expose the semiconductor layer 101 in the dicing regions 110. In the second step, a melting laser beam Lm is irradiated onto the exposed surface of the semiconductor layer 101 to planarize it along the dicing regions 110.

Figure 4A:
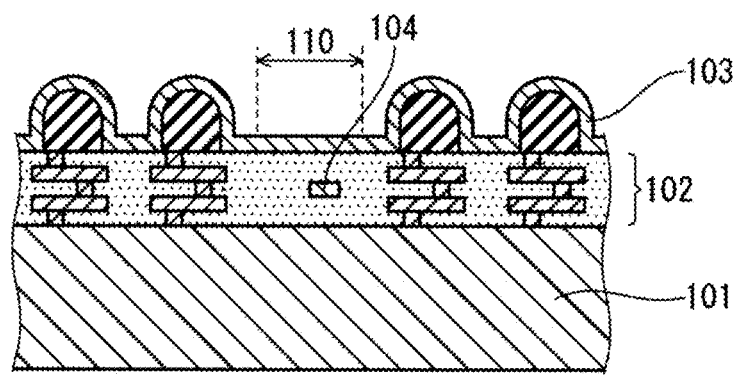
FIGS. 4A-4C are schematic cross-sectional views of the substrate showing a laser grooving step of the manufacturing process according to a first embodiment.
Figure 4B:
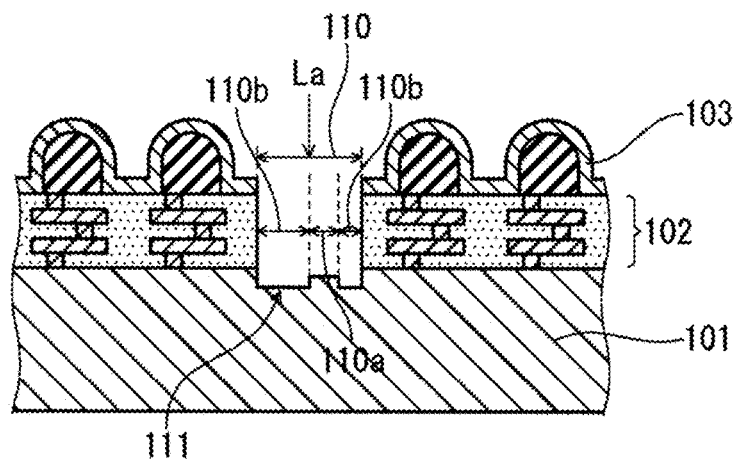
Figure 4C:
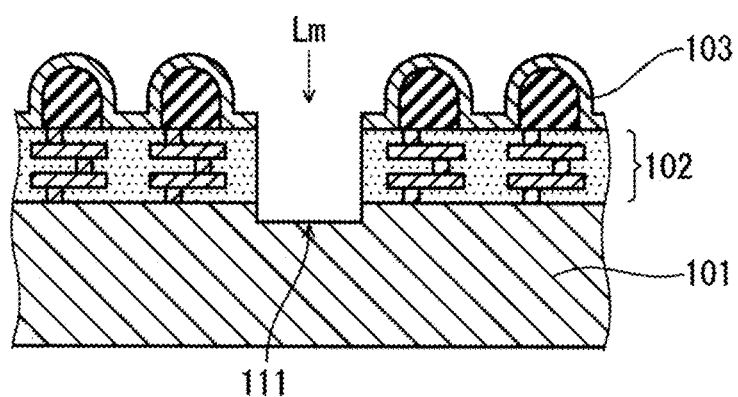

Referring to FIGS. 4A-4C, the laser grooving step will be described herein in detail. FIGS. 4A-4C are schematic cross-sectional views of the substrate 10 showing the laser grooving step of the manufacturing process according to the present embodiment.

a) First Step: The substrate 10 is prepared (FIG. 4A), and ablation laser beam La is irradiated onto the resin layer 103 of the substrate 10 along the dicing regions 110 in the first step, which ablates the resin layer 103 and almost all of the wiring layer 102, thereby to expose semiconductor layer 101 in the dicing regions 110 (FIG. 4B).

The ablation laser beam La is irradiated under such a condition that both of the resin layer 103 and the wiring layer 102 are removed by ablation. The ablation laser beam La for ablating the resin layer 103 requires a beam intensity less than that for ablating the wiring layer 102. Thus, the beam intensity Ia of the ablation laser beam La is set greater than a threshold intensity (minimum intensity) TB required for ablating the wiring layer 102 and also greater than a threshold intensity (minimum intensity) TA required for ablating the resin layer 103 (Ia>TB>TA). Typically, the threshold intensity TB of the ablation laser beam La is greater than another threshold intensity (minimum intensity) TD required for ablating the semiconductor layer 101 (TB>TD). Thus, the ablation laser beam La used in the first step may ablate a portion of the semiconductor layer 101. The beam intensity Ia is defined as a central intensity of the ablation laser beam La. Other beam intensity Im, Ic, Ia1, and Ia2 are so defined accordingly.

As illustrated in FIGS. 4A and 4B, the dicing region 110 may have a metal containing area 110a where a metal material 104 is provided in the wiring layer 102 and a non-metal containing area where no metal material 104 is provided in the wiring layer 102 (which is composed solely of an insulating material). As shown, the ablation laser beam La may scribe or dig the semiconductor layer 101 deeper in the non-metal containing area 110b than in the metal containing area 110a, which forms concave portions on the bottom surface of the trench 111 in the non-metal containing area 110b, thereby to make irregularity on the bottom surface of the trench 111.

The pulsed ablation laser beam La may be irradiated once (Na=1) or more sequences (Na≥2) repeatedly in the first step. When the pulsed ablation laser beam La is repeatedly irradiated more sequences (Na≥2), each irradiation sequence of the pulsed ablation laser beam La may be carried out under the conditions same as or different from one another. It should be noted that the irradiation sequence is intended as the series of the scanned irradiation of the pulsed ablation laser beam La rather than the irradiation pulse numbers thereof.

The beam profile of the ablation laser beam La is not limited to a particular one. That is, the beam profile of the ablation laser beam La in the width direction may have a Gaussian distribution or a Top-hat distribution. The Gaussian distribution is a normal distribution. The intensity of the Top-hat distribution is almost the same across the width direction, and 90-98% even at shoulder ends in the Top-hat distribution (where the intensity is rapidly falling down) relative to the intensity at the central region. However, it is preferable that the beam profile of the ablation laser beam La at least in the width direction has the Top-hat distribution. The intensity of the ablation laser beam La having the Top-hat distribution can readily be increased across the width direction so as to ablate the wiring layer 102 with an intense power in an efficient manner.

b) Second Step: The melting laser beam Lm is irradiated onto the exposed surface of the semiconductor layer 101 to melt it along the dicing regions 110 (FIG. 4C).

The melting laser beam Lm is irradiated under a condition such that the semiconductor layer 101 is melted or fused. The beam intensity of the melting laser beam Lm is less than that of the ablation laser beam La used in the first step. Thus, the actual intensity Im of the melting laser beam Lm should be equal to or more than a threshold intensity (minimum intensity) TC of the laser beam required for melting the semiconductor layer 101 but less than the threshold intensity TD required for ablating the semiconductor layer 101 (TD>Im≥TC).

As discussed above, the threshold intensity TB of the ablation laser beam La required for ablating the wiring layer 102 is greater than the threshold intensity TD required for ablating the semiconductor layer 101 (TB>TD). Meanwhile, the threshold intensity TD is greater than the threshold intensity TC of the laser beam required for melting the semiconductor layer 101 (TD>TC). Thus, the actual intensity Im of the melting laser beam Lm should be less than the intensity Ia of the ablation laser beam La (Ia>Im). The relationship among the threshold intensity and the beam intensity are expressed, for example, as: Ia>TB>TD>Im≥TC>TA.

The semiconductor layer 101 having the irregularities on the bottom surface of the trench 111 is melted by irradiating the melting laser beam Lm. The melted semiconductor in the non-metal containing area 110b flows into and fills up with the concave portion on the bottom surface of the trench 111 so that a surface roughness thereon is reduced. Then, the melted semiconductor is hardened so that a flat layer is rebuilt on the bottom surface of the trench 111. Thus, the surface roughness on the bottom surface of the trench 111 formed by the first step is reduced relative to the surface roughness on the bottom surface of the trench 111 processed by the second step. The surface roughness on the bottom surface of the trench 111, which is measured in accordance with the Japanese Industrial Standards (JIS B 0601), may be adjusted to be equal to or less than 0.5 μm.

The debris on side walls of the trench 111 after the first step is diffused with the power of the melting laser beam Lm during the second step, and at least some of the diffused debris is absorbed in the melted semiconductor and incorporated in the newly rebuilt layer on the bottom surfaces of the trench 111. Also, the debris localized around the metal containing areas 110a of the trench 111 after the first step are spread across the bottom surface of the trench 111 after the second step. Thus, the second step planarizes the bottom surface of the trench 111 and also homogenizes the composition of the rebuilt layer. This allows a cleaning step to remove the debris in an efficient manner, and stabilize a plasma process in the following dicing step.

The debris adhering onto the resin layer 103 in the element regions 120 may be removed by cleaning the substrate 10 after the laser grooving step or the dicing step. Alternatively, the debris adhering onto the resin layer 103 may be removed along with the resin layer 103 by cleaning or dissolving the resin layer 103 with a dissolving agent. Furthermore, the debris adhering onto the resin layer 103 may be removed together with the resin layer 103 by ashing the resin layer 103 after the dicing step.

The melting laser beam Lm may be irradiated once (Nm=1) or more sequences (Nm≥2) repeatedly in the second step. When the melting laser beam Lm is repeatedly irradiated more sequences (Nm≥2), each irradiation sequence of the melting laser beam Lm may be carried out under the conditions same as or different from one another.

It is preferable that the beam profile of the melting laser beam Lm at least in the width direction has the Top-hat distribution. The intensity of the melting laser beam Lm having the Top-hat distribution can readily be increased even at the ends in the width direction so that the semiconductor layer 101 is melted across the bottom surface of the trench 111 in an efficient manner. This allows the trenches 111 each having a uniform configuration.

Preferably, the irradiation width or beam width of the melting laser beam Lm in the width direction of the dicing region 110 is designed to be greater than that of the ablation laser beam La. In this instance, the tapered portion of the side wall of the trench 111 and/or the remaining portion that has not been scribed can be removed in a reliable manner, thereby to achieve a uniform configuration of the trenches 111. The irradiation width of the laser beam corresponds to the length along the width direction of the dicing region 110 where the laser beam is irradiated. Typically, the irradiation width of the ablation laser beam La is similar to or substantially the same as the width of the dicing region 110.

Figure 5:
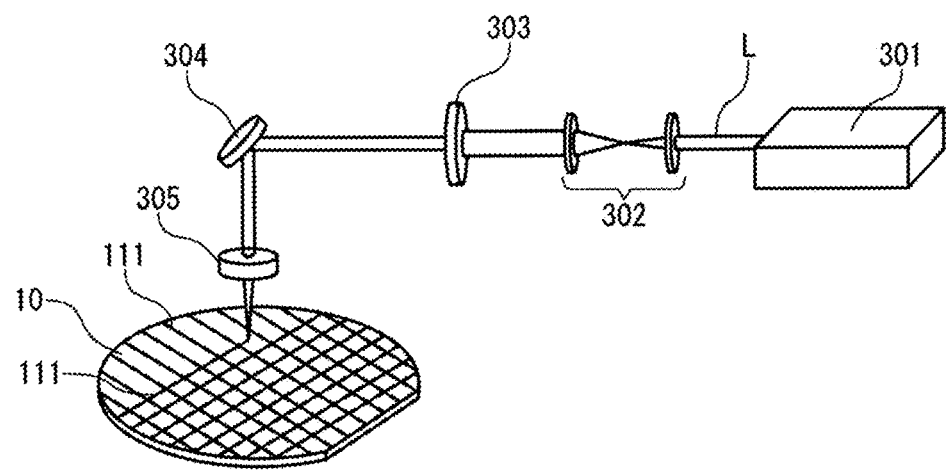
FIG. 5 is a perspective view schematically illustrating a structure of a laser processing machine of the embodiment according to the present invention.

FIG. 5 is a perspective view schematically illustrating a structure of a laser processing machine 300 used for the laser grooving step of the embodiment. The laser processing machine 300 includes, for example, a laser oscillator 301, a collimating lens 302, a mask 303, a beam bender 304, and a collecting lens 305. The laser beam L emitted from the laser oscillator 301 is irradiated onto the collimating lens 302 which adjusts a diameter of the laser beam L to one appropriate for the mask 303. The laser beam L through the collimating lens 302 is then irradiated onto the mask 303 which shapes the laser beam to have the beam diameter corresponding to the width of the dicing region 110 on the substrate 10. The laser beam L through the mask 303 is then reflected at the beam bender 304 to the collecting lens 305 and the substrate 10.

The laser beam L having the Top-hat distribution may be shaped by optically shaping the laser beam having the Gaussian distribution, for example, by means of a Diffractive Optical Element (DOE) or an aspherical beam shaper.

The laser oscillator 301 may preferably be a pulsed-laser oscillator oscillating a pulsed laser beam. This is because the pulsed laser beam gives less thermal impact on the substrate 10 than the continuous-wave laser beam. The mechanism for oscillating the pulsed-wave laser beam is not limited to a particular one, and the pulsed-wave laser oscillator 301 may adapt various mechanisms, which mechanically shutters the laser beam ON and OFF, controls an optical source of the laser beam L to be excited intermittently, or optically switches the laser beam L output therefrom, for example. The type of the laser oscillator 301 is not limited to a particular one, and may be a semiconductor laser oscillator using a semiconductor material as a laser media for laser oscillation, a gas laser oscillator using a gas such as carbon dioxide ($CO_2$) as the laser media, a solid laser oscillator using a solid material such as YAG as the laser media, and a fiber laser oscillator, for example. One or more of those laser oscillators may be adapted individually or in combination.

Although a pulse width of the laser beam L irradiated onto the substrate 10 is not limited to a particular one, it may preferably be 500 ns or less, more preferably 200 ns or less, in order to reduce the thermal impact thereto. Also, although not limited thereto, a peak wavelength of the laser beam L may preferably be in an ultra-violet region (having the peak wavelength between about 200 nm and about 400 nm) to increase an absorption of the laser beam L to the substrate. Furthermore, although not limited thereto, a frequency of the laser beam L may be between about 1 kHz and 200 kHz, preferably between about 10 kHz and 300 kHz. Thus, the higher frequency allows the higher rate processing.

Figure 6A:
FIG. 6A is a photograph of a top side of the substrate after a first step of the manufacturing process according to the first embodiment of the present invention.

FIG. 6A is a photograph depicting the top side of the substrate 10 after the first step. In the first step, the ablation laser beam La was used, which has the Top-hat distribution of the beam diameter of 14.5 μm, the frequency of 60 kHz, and the pulsed energy of 7.5 μJ. The ablation laser beam La was twice scanned along two irradiation preset-lines spaced away from each other by 10 μm in the width direction of the dicing region 110, at a scanning rate of 90 mm/s.

Figure 6B:
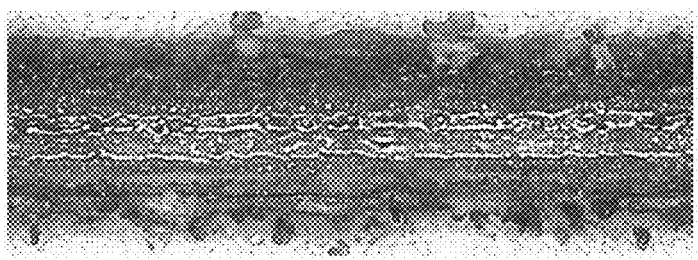
FIG. 6B is a photograph of the top side of the substrate after a second step of the manufacturing process according to the first embodiment of the present invention.

FIG. 6B is a photograph depicting the top side of the substrate 10 after the second step. In the second step, the melting laser beam Lm was used, which has the Top-hat distribution of the beam diameter of 14.5 the frequency of 200 kHz, and the pulsed energy of 2.5 μJ. The melting laser beam Lm was once scanned along the two irradiation preset-lines spaced away from each other by 10 μm in the width direction of the dicing region 110, at the scanning rate of 200 mm/s.

The photograph of FIG. 6A after the first step shows the dicing region 110 having many portions which appear relatively dark. This is considered as a result of a diffused scattering of the illumination light at fine asperity left in the dicing region 110. On the other hand, the photograph of FIG. 6B after the second step shows the dicing region 110 having many portions which are brighter than those of FIG. 6A. This is considered as a result of the flattened dicing region 110 and a reduction of the diffused scattering of the illumination light.

3) Cleaning Step: A cleaning step for removing the debris left on the trench 111 may be carried out after the laser grooving step before the dicing step, which facilitates the plasma processing to be implemented in a more stable and/or reliable manner.

The cleaning step may be carried out by irradiating a cleaning laser beam, of which beam intensity is such that the debris left on the trench 111 is removed. Typically, the beam intensity Ic of the cleaning laser beam is greater than the beam intensity Im of the melting laser beam Lm. For example, the beam intensity Ic of the cleaning laser beam may be more or less equal to the threshold intensity TB of the ablation laser beam La required for ablating the wiring layer 102. To improve the cleaning efficiency, the scanning pitch (or the scanning rate) of the cleaning laser beam is preferably set greater than that of the laser beam in the laser grooving step.

To increase the beam intensity Ic of the cleaning laser beam greater than the threshold intensity TB, it is preferable to irradiate the laser beam (the second melting laser beam) having the beam intensity more or less equal to one of the melting laser beam Lm after irradiating the cleaning laser beam. This allows the bottom surface of the trench 111 to be planarized again even if the cleaning laser beam forms the irregularity thereon.

In the cleaning step, the cleaning laser beam may be used, which has the Top-hat distribution of the beam diameter of 14.5 μm the frequency of 60 kHz, and the pulsed energy of 7.5 μJ. The cleaning laser beam may be once or twice scanned along the two irradiation preset-lines spaced away from each other by 10 μm in the width direction of the dicing region 110, at the scanning rate of 600 mm/s.

Figure 7:
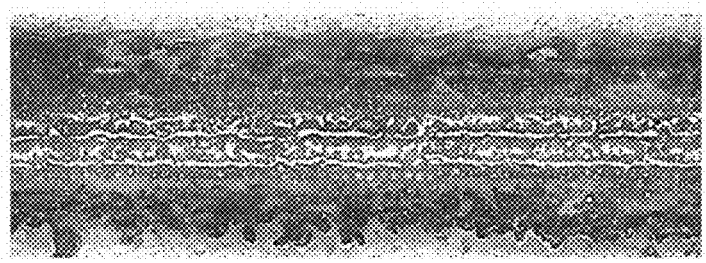
FIG. 7 is a photograph of the top side of the substrate after a cleaning step of the manufacturing process according to the first embodiment of the present invention.

FIG. 7 is a photograph depicting the top side of the substrate 10 after irradiating the cleaning laser beam and the second melting laser beam under the irradiation conditions as described above. When comparing the dicing regions 110 shown in the photographs of FIG. 6B and FIG. 7, the dicing region 110 of FIG. 7 has more portions which appear bright than that of FIG. 6B. This is the result of the cleaning step which further makes the bottom surface in the dicing region 110 even flatter.

The cleaning laser beam may be irradiated once (Nc=1) or more sequences (Nc≥2) repeatedly. When the cleaning laser beam is repeatedly irradiated more sequences (Nc≥2), each irradiation sequence of the cleaning laser beam may be carried out under the conditions same as or different from one another. The cleaning laser beam have the beam intensity and the beam profile which are not limited to particular ones, and may have the Gaussian distribution or the Top-hat distribution, for example.

The cleaning step may be carried out by the plasma process. The plasma atmosphere for cleaning the trenches 111 may be generated under the condition different from one for dicing the substrate 10. The plasma process in the cleaning step preferably uses the source gases for removing the components of the semiconductor layer 101 such as silicon and silicon oxide.

The plasma cleaning step may be carried out for about 1-2 minutes in the plasma atmosphere generated within a plasma processing apparatus as will be described hereinafter, by applying an antenna with the high-frequency power of 1000-2000 W while supplying a mixed gas of $SF_6$ and $O_2$ at a rate of 200 sccm to have the pressure of 5 Pa in the vacuum chamber 203. Also, a high-frequency electrode provided with a stage may be applied with the high-frequency power of about 150 W to increase the removing efficiency of the debris.

Figure 8A:
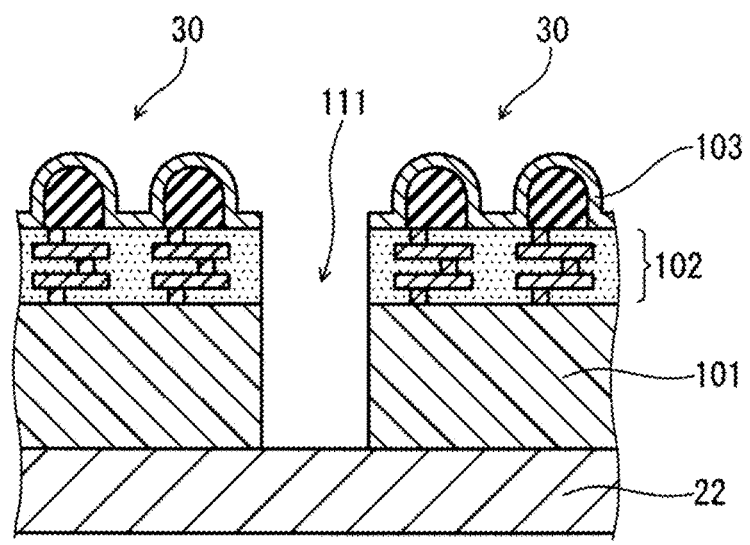
FIGS. 8A and 8B are schematic cross-sectional views of the substrate showing an individualizing or dicing step of the manufacturing process according to the embodiment.
Figure 8B:
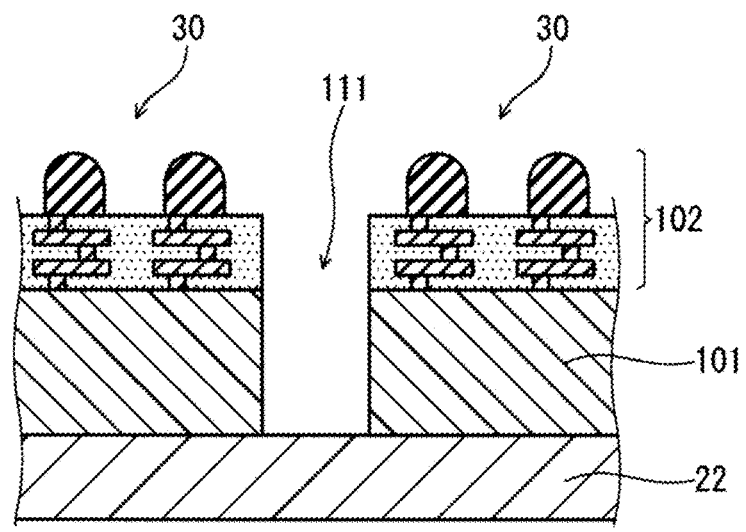

4) Dicing Step: Next, referring to FIGS. 8A and 8B, a dicing step will be described herein. FIGS. 8A and 8B are cross sectional views schematically depicting a portion of the substrate 10 in the dicing step.

The substrate 10 having the trenches 111 formed thereon is exposed within the plasma atmosphere to etch the remaining portion in the depth direction along the dicing region 110, thereby to dice or separate the substrate 10 into a plurality of element chips 30 each having the element regions 120. The resin layer 103 provided uppermost over the substrate 10 performs a function as a mask for protecting the element regions 120.

Figures 9A, 9B:
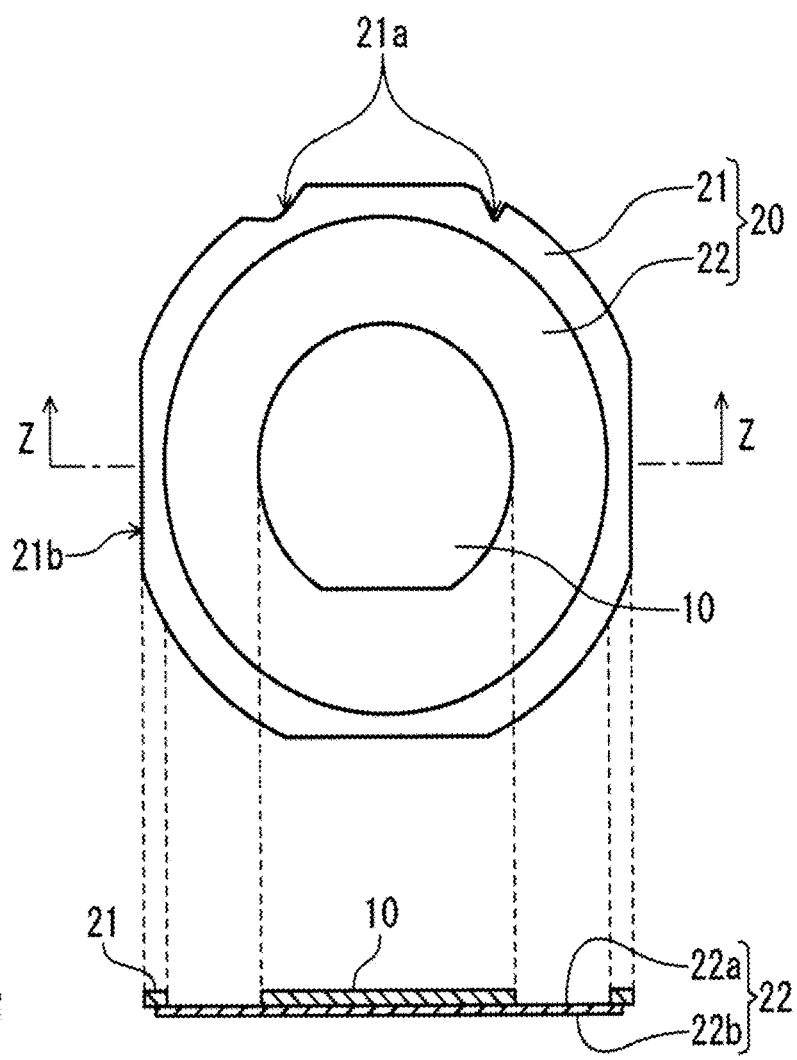
FIG. 9A is a top plan view schematically illustrating a conveying carrier and the substrate held thereon according to the embodiment.
FIG. 9B is a cross-sectional view taken along a line Z-Z of FIG. 9A.

The dicing step may preferably be carried out with the substrate 10 being held on the base material 22 for ease of handling thereof. The base material 22 adheres onto the second side 10Y of the substrate 10. Although the base material 22 is not limited to a particular one, as the substrate 10 is subjected to be diced with the base material 22 thereon, it is preferably made of a flexible resin film to facilitate each of the diced element chips 30 to be readily picked up from the base material 22. Also, as depicted in FIG. 9, the base material 22 is held on a frame 21 for easy handling thereof. The present disclosure may refer the frame 21 and the base material 22 held thereon collectively as a conveying carrier 20. FIG. 9A is a top plan view of the conveying carrier 20 and the substrate 10 held on the base material 22, and FIG. 9B is a cross sectional view taken along a line Z-Z of FIG. 9A.

Although the resin film may be made of any material, it may be made of a thermoplastic resin including, for example, polyethylene, polyolefin such as polypropylene, and polyester such as polyethylene terephthalate. The resin film may contain various additives including, for example, a rubber component for adding the stretching property (for example, ethylene-propylene rubber (EPM), ethylene-propylene-diene rubber (EPDM)), a plasticizer, a softener, an antioxidant, and a conductive material. Also, the thermoplastic resin may contain a functional group showing a photopolymerization reaction such as an acryl group.

The base material 22 includes an upper side 22a (an adhesive side) having an adhesive thereon and a lower side 22b (a non-adhesive side 22b) having no adhesive thereon. The periphery of the adhesive side 22a adheres to the bottom side of the frame 21 and the base material 22 covers an opening of the frame 21. An exposed portion in the opening of the adhesive side 22a adheres to the second side 10Y of the substrate 10. During the plasma process, the base material 22 is seated on a plasma processing stage (which is referred to simply as a stage) so that the non-adhesive side 22b is in contact with the stage.

The adhesive side 22a preferably contains an adhesive material of which adhesibility is weakened with an ultra-violet beam (UV-radiation). This allows each of the diced element chips obtained after the plasma-dicing step to easily be peeled off and picked up from the adhesive side 22a with the UV-radiation. The base material 22 may be formed, for example, by applying an UV-curing acrylic adhesive on the adhesive side 22a of the resin film to have a thickness of 5-20 μm.

The frame 21 contains the opening of an area equal to or more than the whole substrate 10, and has a predetermined width and a substantially constant thickness. Also, the frame 21 has such a rigidity that it can be transferred or delivered with the base material 22 and the substrate 10 adhering thereto. Although the shape of the opening of the frame 2 is not limited to a particular one, it may be in a shape of a circle, a polygon such as a rectangle and a hexagon. The frame 21 may be provided with a notch 21a and/or a corner cut 21b for alignment thereof. Also, the frame 2 may be formed of, for example, a metal such as aluminum and stainless steel, or a resin.

Figure 10:
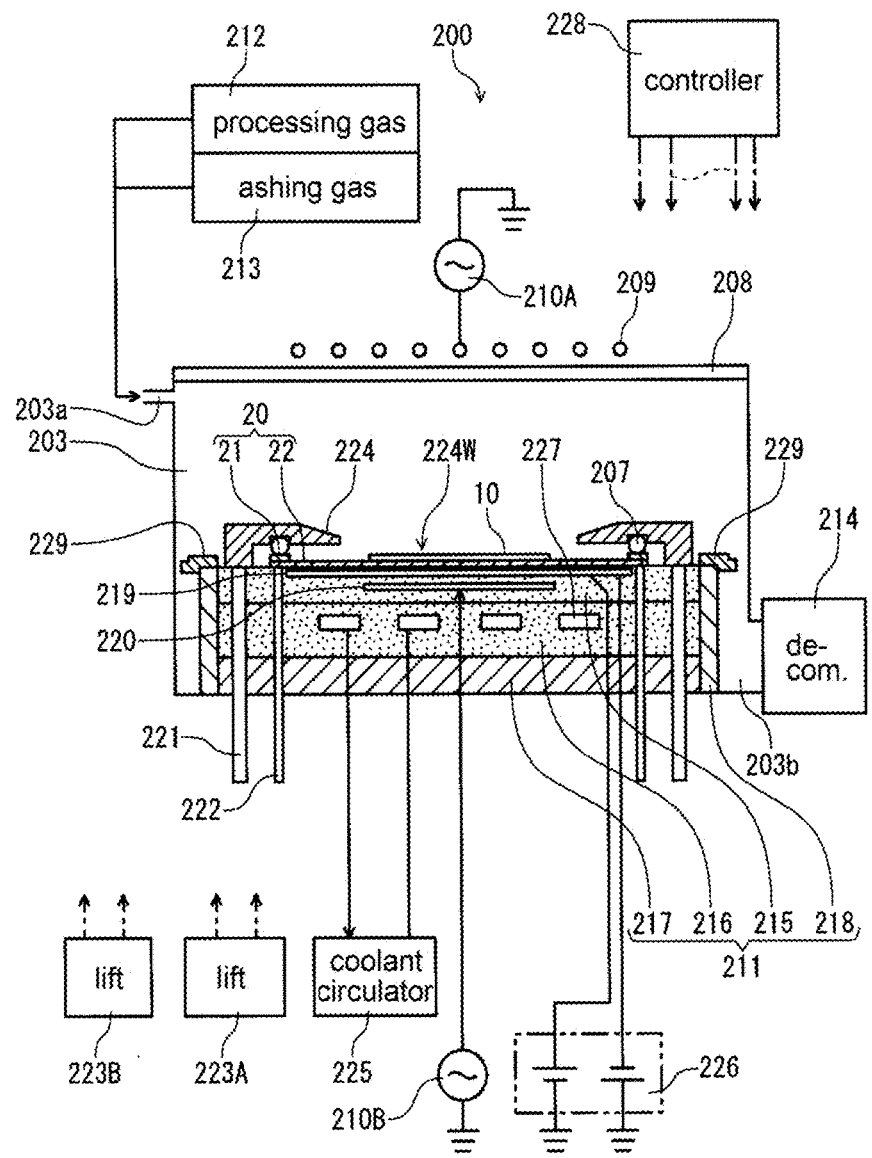
FIG. 10 is a conceptual view depicting a schematic structure in a cross section of a plasma processing apparatus of the embodiment according to the present invention.

Next, referring to FIG. 10, a plasma processing apparatus 200 used in a plasma-dicing step will be described in detail hereinafter, although it is not limited thereto. FIG. 10 depicts a schematic structure in a cross section of the plasma processing apparatus 200 used in the present embodiment.

The plasma processing apparatus 200 includes a stage 211, on which the conveying carrier 20 is seated so that the adhesive side 22a of the base material 22 (which adheres to and supports the substrate 10) faces upwardly. Arranged over the stage 211 is a cover 224 which covers at least a portion of the frame 21 and the base material 22 and includes a window 224W exposing at least a portion of the substrate 10. The cover 224 is provided with a biasing member 207 for biasing the frame 21 downwardly when the frame 2 is seated on the stage 211. The biasing member 207 may preferably be a component such as a coil spring and an elastic resin for achieving a point contact with the frame 21. This restricts a thermal communication between the frame 21 and the cover 224, and also allows correcting a distortion of the frame 21.

The stage 211 and the cover 224 are received in a reaction chamber (a vacuum chamber) 203. The vacuum chamber 203 is shaped in a substantially cylindrical configuration having an opening at the top thereof, which is closed by a dielectric member 208 formed as a lid of the vacuum chamber 203. The vacuum chamber 203 may be formed of aluminum, stainless steel (SUS), or aluminum with anodic oxide coating, for example. The dielectric member 208 may be formed of yttrium oxide ($Y_2O_3$), aluminum nitride (AlN), alumina ($Al_2O_3$), or quartz ($SiO_2$), for example. Arranged on or above the dielectric member 208 is a top or first electrode 209. The first electrode 209 is electrically connected to a first high-frequency power source 210A. The stage 211 is positioned at the bottom side in the vacuum chamber 203.

The vacuum chamber 203 is provided with a gas inlet 203a for introducing a gas and a gas outlet 203b for exhausting the gas. The gas inlet 203a is configured to be connected selectively to one of a material gas source such as a processing gas source 212 and an ashing gas source 213 each through a conduit. The outlet 203b is connected to a decompressing mechanism 214 having a vacuum pump for exhausting a gas within the vacuum chamber 203 and decompressing it.

The stage 211 includes an electrode layer 215, a metal layer 216, and a base member 217 supporting the electrode layer 215 and the metal layer 216, each having a substantially circular shape. The stage 211 also includes a peripheral member 218 surrounding the electrode layer 215, the metal layer 216, and the base member 217. The peripheral member 218 is formed of a metal having a conductivity and an etching resistance for protecting the electrode layer 215, the metal layer 216, and the base member 217 from the plasma exposure. Provided on an upper surface of the peripheral member 218 is an annular circumferential ring 229 for protecting it from the plasma exposure. The electrode layer 215 and the circumferential ring 229 may be formed of the dielectric material as listed above.

Arranged within the electrode layer 215 are a first or electrostatic chuck (ESC) electrode 219 and a second or high-frequency electrode 220 electrically connected to a second high-frequency power source 210B. The ESC electrode 219 is electrically connected to a DC power source 226. The electrostatic chucking mechanism is composed of the ESC electrode 219 and the DC power source 226.

The metal layer 216 may be formed of aluminum with an anodic oxidation coating, for example. The metal layer 216 contains a coolant channel 227 configured to cool the stage 211. Cooling the stage 211 causes the base material 22 on the stage 211 cooled down, as well as the cover 224 whose portion contacts with the stage 211. This protects the substrate 10 and the base material 22 from being damaged due to a heat applied during the plasma processing step. A coolant in the coolant channel 227 is circulated by a coolant circulation apparatus 225.

Provided around the peripheral portion of the stage 211 is a plurality of supporting members 222 extending therethrough. Each of the supporting members 222 supports the frame 21 of the conveying carrier 20. The supporting members 222 are driven by a lifting mechanism 223A to move upward and downward. The conveying carrier 20 is delivered into the vacuum chamber 203, and passed on the supporting members 222 which has been raised at a given level. Then the supporting members 222 are lowered with the top surface being flush with or lower than the stage 211, which sets the conveying carrier 20 on the stage 211 at a predetermined position thereof.

Also, a plurality of lifting rods 221 are coupled to the peripheral edge of the cover 224 for moving it upward and downward. The lifting rods 221 are driven by another lifting mechanism 223B. The operation of the lifting mechanisms 223A, 223B can be controlled independently each other.

The controller 228 is configured to control operations of the plasma processing apparatus 200 which includes the first high-frequency power source 210A, the second high-frequency power source 210B, the processing gas source 212, the ashing gas source 213, the decompressing mechanism 214, the coolant circulation apparatus 225, the lifting mechanisms 223A, 223B, and the electrostatic chucking mechanism.

The plasma atmosphere is generated under the condition suitable for etching the remaining portion (mostly the semiconductor layer 101) of the substrate 10. The condition is selected appropriately in accordance with the material of the semiconductor layer 101. When the semiconductor layer 101 is made of silicon, the Bosch process may be used to etch the semiconductor layer 101 along the dicing region or groove. The Bosch process includes a film depositing step, a film etching step, and a silicon etching step in series which are repeated to etch or dig the semiconductor layer 101 in the depth direction.

The film depositing step is carried out under the condition where supplying a source gas of $C_4H_8$ at a rate of 150-250 sccm to have the pressure in the vacuum chamber 203 controlled between 5-15 Pa, the antennas 209 is applied with the first high-frequency power of 1500-2500 W, while the high-frequency electrode 220 is applied with the second high-frequency power of 0 W, for 5-15 seconds.

The film etching step is carried out under the condition where supplying a source gas of $SF_6$ at a rate of 200-400 sccm to have the pressure in the vacuum chamber 203 controlled between 5-15 Pa, the antennas 209 is applied with the first high-frequency power of 1500-2500 W, while the high-frequency electrode 220 is applied with the second high-frequency power of 100-300 W, for 2-10 seconds.

The silicon etching step is carried out under the condition where supplying a source gas of $SF_6$ at a rate of 200-400 sccm to have the pressure in the vacuum chamber 203 controlled between 5-15 Pa, the antennas 209 is applied with the first high-frequency power of 1500-2500 W, while the high-frequency electrode 220 is applied with the second high-frequency power of 50-200 W, for 10-20 seconds.

The film depositing step, the film etching step, and the silicon etching step are repeatedly carried out under the aforementioned conditions so that each of the grooves can be etched in the vertical or depth direction at a rate of 10 μm per minute. Several types of the source gases may be used together for generation of the plasma atmosphere. In this instance, those source gases may be introduced in the vacuum chamber 203 in series with time lags or may be mixed and introduced in the vacuum chamber 203.

As described above, the substrate 10 is diced into a plurality of the element chips 30 each having the element regions 120 while the substrate 10 is held on the base material 22 (FIG. 8A). After the dicing step, a plurality of the element chips 30 held on the base material 22 are delivered to a pick-up step, in which each of the element chips 30 is detached or picked up from the base material 22 to obtain the separate element chips 30.

Also, after the dicing step, the resin layer 103 remaining on the element chips 30 may be removed by ashing or cleaning step (FIG. 8B). In this case, the debris, which adhere to the resin layer 103 in the element regions 120 during the laser grooving step, can be removed together with the resin layer 103.

Second Embodiment

Figure 11:
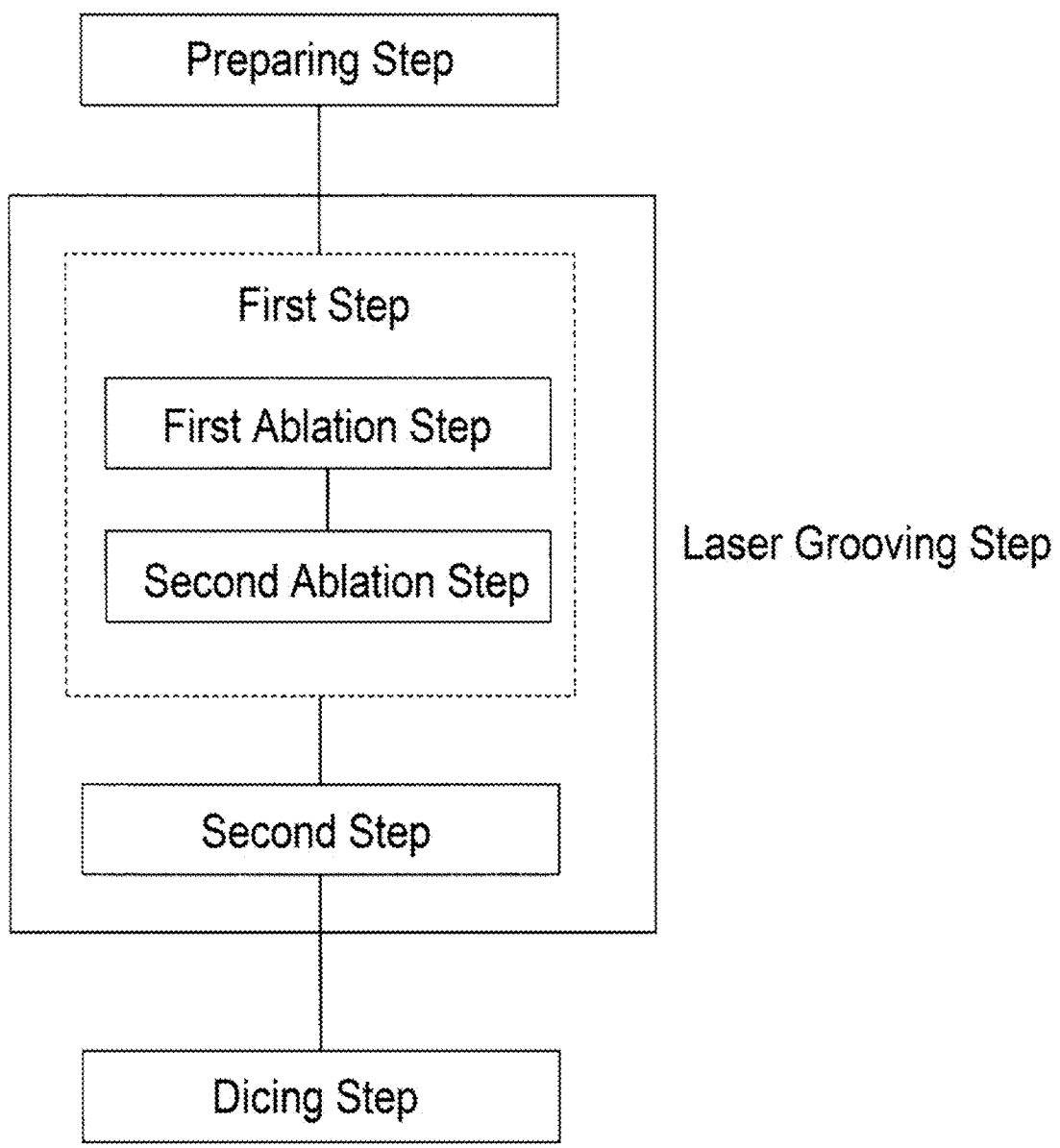
FIG. 11 is a flowchart illustrating some steps of a manufacturing process of an element chip according to a second embodiment of the present invention.
Figure 12A:
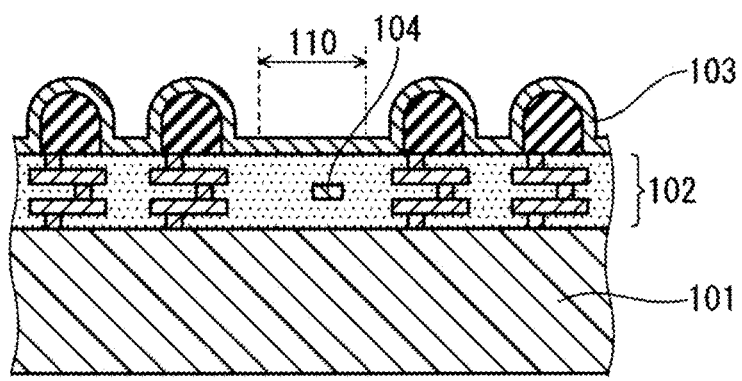
FIGS. 12A-12D are schematic cross-sectional views of the substrate showing the laser grooving step of the manufacturing process according to a second embodiment.
Figure 12B:
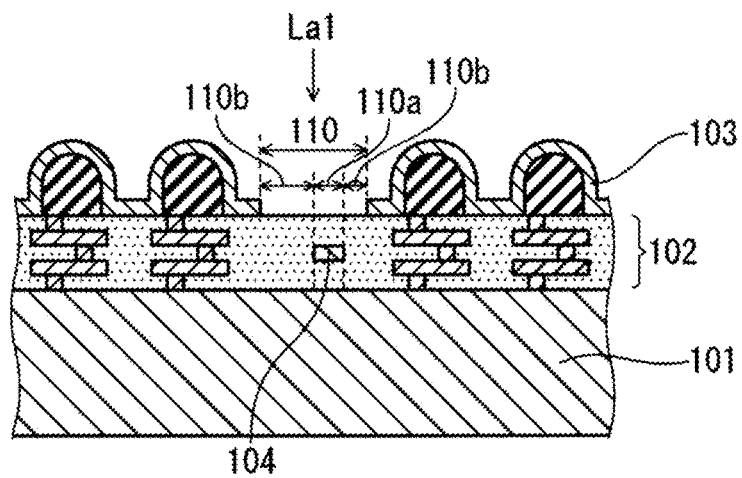

The manufacturing process of the element chip according to the second embodiment is similar to one of the first embodiment except that the first step of the laser grooving step includes a first ablation step for ablating the resin layer and a second ablation step for ablating the wiring layer. FIG. 11 is a flowchart illustrating some steps of the manufacturing process of the element chip according to the second embodiment, and FIGS. 12A-12D are schematic cross-sectional views of the substrate showing the laser grooving step of the manufacturing process according to the second embodiment.

a) First Ablation Step: A first ablation laser beam La1 is irradiated onto the resin layer along the dicing region 110 of the substrate 10 (FIG. 12A) to expose the wiring layer 102 (FIG. 12B).

The first ablation laser beam La1 is irradiated under such a condition to ablate the resin layer 103. Typically, the ablation laser beam for ablating the resin layer 103 requires a beam intensity less than that for ablating the wiring layer 102. Thus, the intensity Ia1 of the first ablation laser beam La1 is set greater than a threshold intensity (minimum intensity) TA required for ablating the resin layer 103 but less than the threshold intensity (minimum intensity) TB required for ablating the wiring layer 102 (TB>Ia1>TA).

The first ablation laser beam La1 may be irradiated once ($Na_1=1$) or more sequences ($Na_1 \geq 2$) repeatedly in the first ablation step. When the first ablation laser beam La1 is repeatedly irradiated more sequences ($Na_1 \geq 2$), each irradiation sequence of the first ablation laser beam La1 may be carried out under the conditions same as or different from one another. It should be noted that the irradiation sequence is intended as the series of the scanned irradiation of the ablation laser beam La1 rather than the irradiation pulse numbers thereof.

Figure 12C:
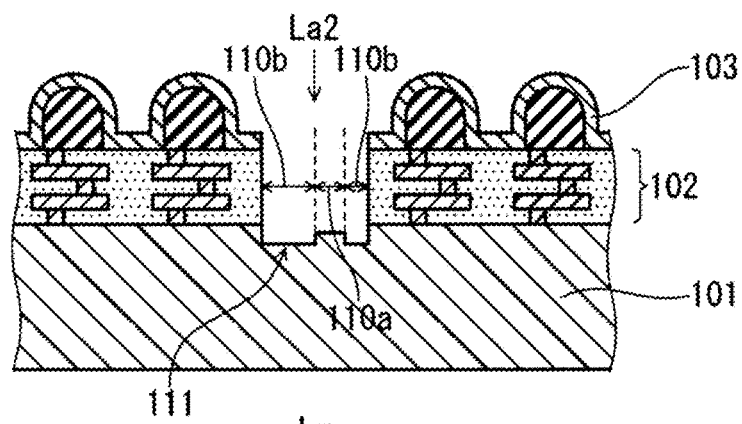

The beam profile of the first ablation laser beam La1 is not limited to a particular one. That is, the beam profile of the first ablation laser beam La1 in the width direction may have a Gaussian distribution or a Top-hat distribution. The Gaussian distribution is a normal distribution. The intensity of the Top-hat distribution is almost the same across the width direction.

b) Second Ablation Step: A second ablation laser beam La2 is irradiated onto the wiring layer 102 along the dicing region 110 of the substrate 10 (FIG. 12B) to expose the semiconductor layer 101 (FIG. 12C). Most or all of the wiring layer 102 along the dicing region 110 are removed in the second ablation step so that the semiconductor layer 101 is exposed across the bottom surface of the trench 111.

The second ablation laser beam La2 is irradiated under such a condition to ablate the wiring layer 102. The intensity Ia2 of the second ablation laser beam La2 is set greater than a threshold intensity (minimum intensity) TB required for ablating the wiring layer 102 (Ia2>TB). Typically, the threshold intensity TB is greater than that required for ablating the semiconductor layer 101 (TB>TD). Therefore, the second ablation step may ablate a portion of the semiconductor layer 101 along with the wiring layer 102.

As illustrated in FIG. 12C, the second ablation laser beam La2 may scribe or dig the semiconductor layer 101 deeper in the non-metal containing area 110b where no metal material 104 is provided in the wiring layer 102, than in the metal containing area 110a where the metal material 104 is provided in the wiring layer 102. This forms concave portions on the bottom surface of the trench 111 in the non-metal containing area 110b, thereby to make irregularity on the bottom surface of the trench 111.

The second ablation laser beam La2 may be irradiated once ($Na_2$=1) or more sequences ($Na_2 \geq 2$) repeatedly in the second ablation step. When the second ablation laser beam La2 is repeatedly irradiated more sequences ($Na_2 \geq 2$), each irradiation sequence of the second ablation laser beam La2 may be carried out under the conditions same as or different from one another.

Figure 12D:
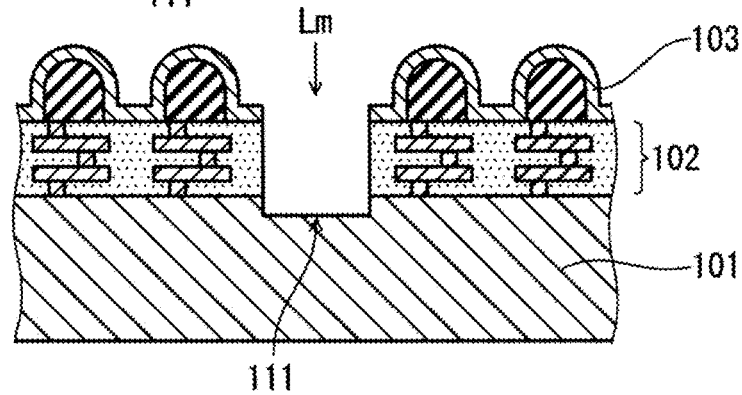

Although the beam profile of the second ablation laser beam La2 is not limited to a particular one, preferably it has the Top-hat distribution at least in the width direction. While the high power is required for ablating the wiring layer 102, the second ablation laser beam La2 having the Top-hat distribution can remove the wiring layer 102 in an efficient manner.

c) Second Step: The melting laser beam Lm is irradiated onto the exposed semiconductor layer 101 to melt it along the dicing region 110 (FIG. 12D).

The intensity of the melting laser beam Lm is less than that of the second ablation laser beam La2 used in the second ablation step, and greater than that of the first ablation laser beam La1 used in the first ablation step (Ia2>Im≥Ia1). Thus, a following relationship is satisfied among the threshold intensities and the beam intensities, Ia2>TB>TD>Im≥TC>Ia1>TA.

Preferably, the irradiation width of the melting laser beam Lm in the width direction across the dicing region 110 is greater than that of the second ablation laser beam La2. In this instance, the tapered portion of the side wall of the trench 111 and/or the remaining portion that has not been scribed are removed in an efficient or reliable manner, thereby to form a uniform configuration of the trench 111. Typically, the irradiation width of the second ablation laser beam La2 is similar to or substantially the same as the width of the dicing region 110.

Third Embodiment

Figure 13:
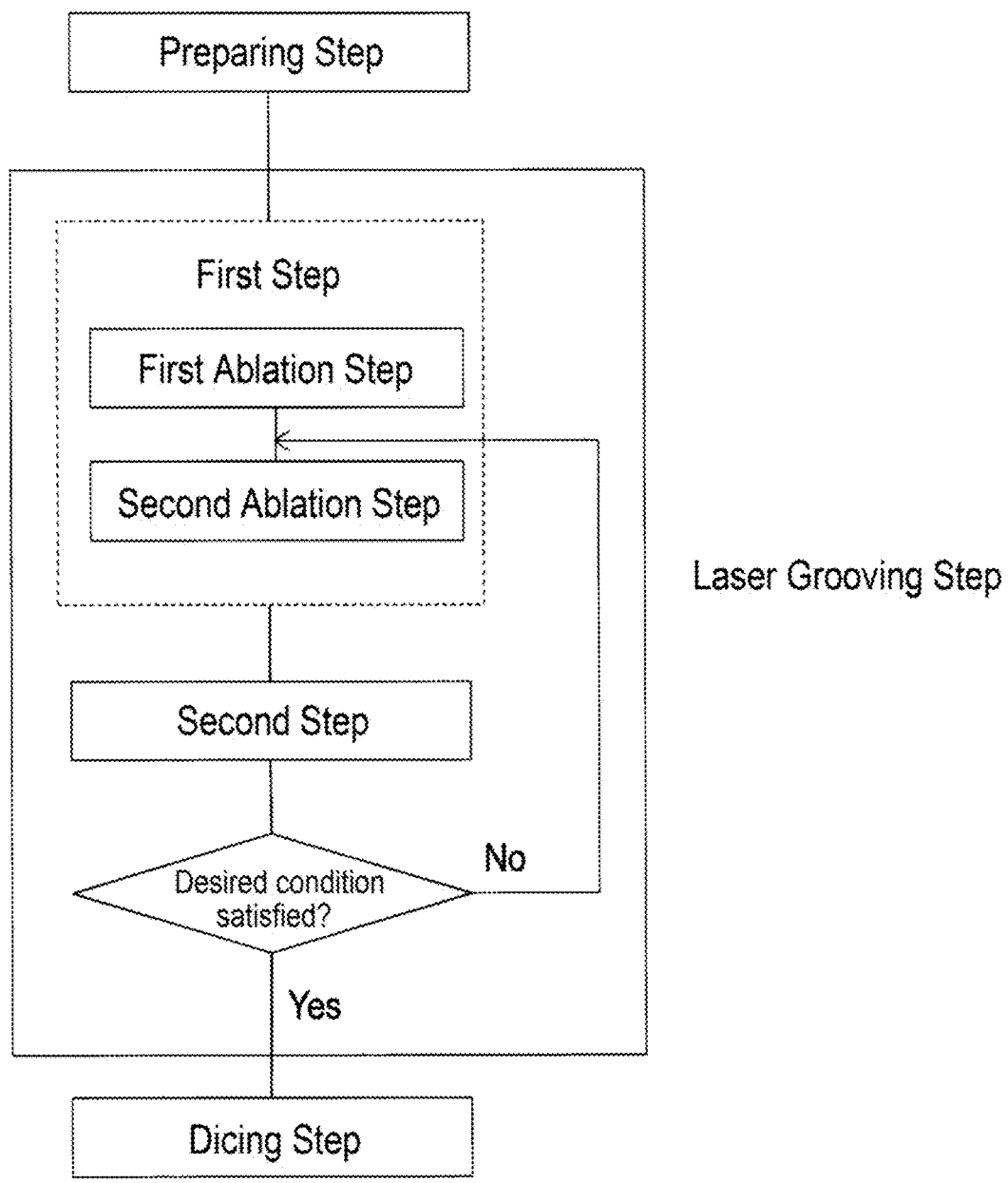
FIG. 13 is a flowchart illustrating some steps of a manufacturing process of an element chip according to a third embodiment of the present invention.

The manufacturing process of the element chip according to the third embodiment is similar to one of the second embodiment except that after the first ablation step, a combination of the second ablation step and the second step is repeated multiple times in the laser grooving step. FIG. 13 is a flowchart illustrating some steps of the manufacturing process of the element chip according to the third embodiment. The manufacturing process according to the third embodiment removes the wiring layer while planarizing the bottom surface of an incomplete or unfinished trench 111 formed by the second ablation step and enhancing a perpendicularity of the side wall thereof, thereby to form a uniform configuration of the complete trench 111.

The second ablation step and the second step may be repeated multiple times (not particular times, for example, a predetermined number of times) until a desired condition is satisfied. Alternatively, the second ablation step and the second step may be repeated until the bottom surface of the incomplete or unfinished trench is planarized to be a desired condition. In each combination of the second ablation step and the second step, the laser beam may be irradiated once or more times.

Fourth Embodiment

Figure 14:
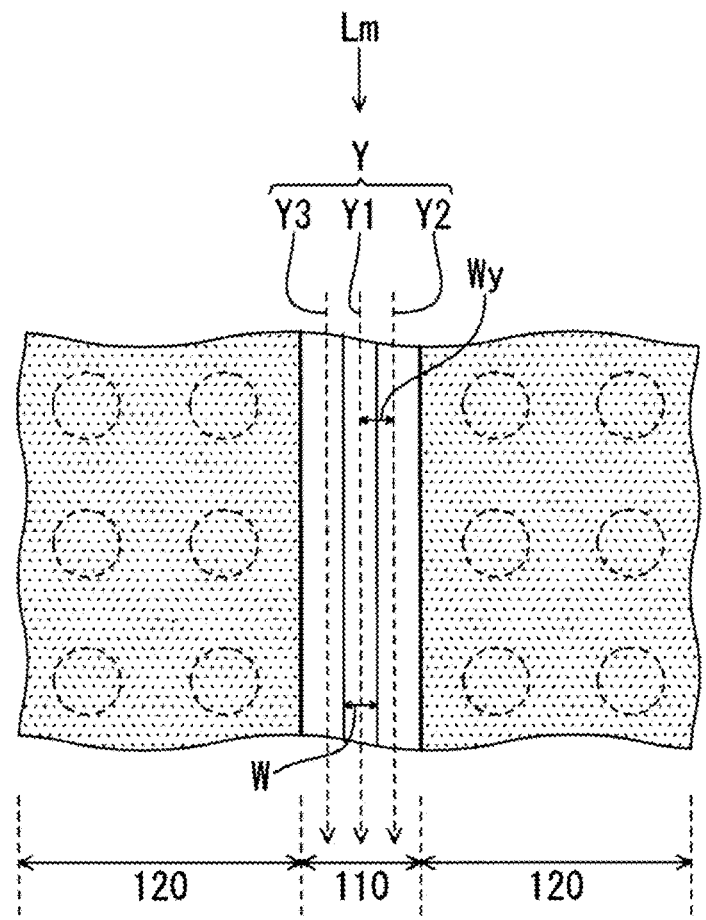
FIG. 14 is a top plan view schematically illustrating a portion of the substrate showing a second step of the manufacturing process according to a fourth embodiment.

In the fourth embodiment, the melting laser beam Lm is irradiated multiple times ($Nm \geq 2$) in the second step along the irradiation preset-lines, each of which is spaced away from another one in the width direction and extends in the longitudinal direction of the dicing region 110. Besides, the manufacturing process according to the fourth embodiment is similar to that of the second embodiment. FIG. 14 is a top plan view schematically depicting a portion of the substrate 10 in the second step according to the fourth embodiment.

The melting laser beam Lm is shaped to have the beam width W in the width direction narrower than the width of the dicing region 110, and a distance Wy between two of the adjacent irradiation preset-lines (e.g., between irradiation preset-lines Y3 and Y1 and between irradiation preset-lines Y2 and Y1) are defined as narrower than the beam width W. This achieves some irradiation regions on which the melting laser beam Lm irradiated along the multiple irradiation preset-lines overlap one another, which efficiently planarizes the bottom surface of the trench 111. Also, the first ablation laser beam La1 and the second ablation laser beam La2 may be irradiated along the multiple irradiation preset-lines, so that some irradiation regions of the laser beams La1, La2 overlap each other.

The debris may be caused even by the melting laser beam Lm. Such debris likely adhere outside the irradiation regions of the melting laser beam Lm. For example, when the melting laser beam Lm is irradiated on a middle portion of the dicing region 110 (or the trench 111) along the irradiation preset-line Y1, the debris may likely adhere to both sides in the width direction. Similarly, when the melting laser beam Lm is irradiated on the side portions of the dicing region 110, the debris may likely adhere to the middle portion in the width direction.

According to the present embodiment, the melting laser beam Lm having the small beam width are irradiated multiple times along three of the irradiation preset-lines Y1, Y2, Y3, in which the melting laser beam Lm is lastly irradiated on either one of the side portions of the dicing region 110, for example, along the irradiation preset-line Y3. In this instance, the debris caused by the last irradiation likely adhere to the middle portion of the dicing region 110. However, the semiconductor layer 101 in the middle portion of the trench 111 is readily etched in the following cleaning step and the plasma processing step so that the debris is also easily removed. The second last irradiation of the melting laser beam Lm is made on another one of the side portions of the dicing region 110, for example, along the irradiation preset-line Y2 in FIG. 14, which also likely causes the debris in the middle portion. At least a portion of the debris caused by the melting laser beam Lm prior to the last irradiation may be removed by the melting laser beam Lm irradiated prior to the last one.

In particular, the melting laser beam Lm is irradiated in a following manner. Firstly, the melting laser beam Lm is irradiated in the middle portion of the dicing region 110 along the irradiation preset-line Y1. Next, the melting laser beam Lm is irradiated in one side portion of the dicing region 110 along the irradiation preset-line Y2. Lastly, the melting laser beam Lm is irradiated in another side portion of the dicing region 110 along the irradiation preset-line Y3.

Although FIG. 14 depicts three of the irradiation preset-lines in the width direction along the dicing region 110, the number of the irradiation preset-lines is not limited thereto. Even if the melting laser beam Lm is irradiated along four or more of the irradiation preset-lines in the width direction of the dicing region 110, the last irradiation is made along the irradiation preset-line closest to one side portion of the dicing region 110. FIG. 14 depicts the beam width W of the melting laser beam Lm irradiated along the irradiation preset-line Y1.

The manufacturing processes of the element chips according to the present invention are useful to achieve the desired plasma-dicing step, thereby to produce the elements chips from various types of the substrates.

REFERENCE NUMERALS

10: substrate, 10X: first side (top side), 10Y: second side (bottom side), 101: semiconductor layer, 102: wiring layer, 102a: low-k material, 102b: metal wire, 102c: bump, 103: resin layer, 104: metal material, 110: dicing region, 110a: metal containing area, 110b: non-metal containing area, 111: trench, 120: element region, 20: conveying carrier, 21: frame, 21a: notch, 21b: corner cut, 22: base material, 22a: adhesive side, 22b: non-adhesive side, 30: element chip, 200: plasma processing apparatus, 203: vacuum chamber, 203a: gas inlet, 203b: gas outlet, 207: biasing member, 208: dielectric member, 209: antenna, 210A: first high-frequency power source, 210B: second high-frequency power source, 211: stage, 212: processing gas source, 213: ashing gas source, 214: decompressing mechanism, 215: electrode layer, 216: metal layer, 217: base member, 218: peripheral member, 219: ESC electrode, 220: high-frequency electrode, 221: lifting rod, 222: supporting rod, 223A, 223B: lifting mechanism, 224: cover, 224W: window, 225: coolant circulation apparatus, 226: DC power source, 227: coolant channel, 228: controller, 229: circumferential ring, 300: laser processing machine, 301: laser oscillator, 302: collimating lens, 303: mask, 304: beam bender, 305: collecting lens

What is claimed is:

1. A manufacturing process of an element chip, comprising:
    a preparing step for preparing a substrate having first and second sides opposed to each other, the substrate containing a semiconductor layer, a wiring layer and a resin layer formed on the first side, and the substrate including a plurality of dicing regions and element regions defined by the dicing regions;
        a laser grooving step for irradiating a laser beam onto the dicing regions to form grooves so as to expose the semiconductor layer along the dicing regions; and
        a dicing step for plasma-etching the semiconductor layer along the dicing regions through the second side to divide the substrate into a plurality of the element chips,
    the laser grooving step comprising first and second steps, wherein the first step includes irradiating an ablation laser beam to ablate the resin layer and the wiring layer so as to expose the semiconductor layer along the dicing regions, and wherein the second step includes irradiating a melting laser beam to melt the exposed semiconductor layer along the dicing regions,
    the first step comprising first and second ablation steps using first and second ablation laser beam, respectively, wherein the first ablation step includes irradiating the first ablation laser beam to ablate the resin layer so as to expose the wiring layer along the dicing regions, and wherein the second ablation step includes irradiating the second ablation laser beam to ablate the wiring layer so as to expose the semiconductor layer along the dicing regions.

2. The manufacturing process of the element chip according to claim 1,
    wherein when TA is defined as a threshold of a beam intensity required for ablating the resin layer, TB is defined as a threshold of a beam intensity required for ablating the wiring layer, TC is defined as a threshold of a beam intensity required for melting the semiconductor layer, and TD is defined as a threshold of a beam intensity required for ablating the semiconductor layer, a following relationship is satisfied,
    TB>TD>TC>TA, and
    wherein when the first ablation laser beam has a beam intensity Ia1, the second ablation laser beam has a beam intensity Ia2, and the melting laser beam has a beam intensity Im, a following relationship is satisfied,
    Ia2>Im>Ia1, and TD>Im≥TC.

3. The manufacturing process of the element chip according to claim 1, wherein a combination of the first ablation step and the second step is repeated multiple times in the laser grooving step.

4. The manufacturing process of the element chip according to claim 1, wherein a beam profile of the melting laser beam in a width direction of the dicing region has a Top-hat distribution.

5. The manufacturing process of the element chip according to claim 1, wherein an irradiation width of the melting laser beam in a width direction of the dicing region is greater than that of the second ablation laser beam.

6. The manufacturing process of the element chip according to claim 1,
    wherein a beam width of the melting laser beam in a width direction of the dicing region is less than a width of the dicing region,
    wherein the melting laser beam is irradiated multiple times in the second step along a plurality of irradiation preset-lines, each of which is spaced away by a predetermined distance from adjacent one in the width direction and extends in a longitudinal direction of the dicing region, and
    wherein the predetermined distance between the adjacent irradiation preset-lines is less than the beam width.

7. The manufacturing process of the element chip according to claim 6,
    wherein the melting laser beam is irradiated multiple times in the second step along three or more irradiation preset-lines, and wherein the last irradiation of the melting laser beam is made along the irradiation preset-line closest to one side portion of the dicing region.

* * * * *